United States Patent [19]

Kostrov

[11] Patent Number: 4,568,881
[45] Date of Patent: Feb. 4, 1986

[54] PHASE COMPARATOR AND DATA SEPARATOR

[75] Inventor: Anna Kostrov, Plymouth, Minn.

[73] Assignee: Magnetic Peripherals Inc., Minneapolis, Minn.

[21] Appl. No.: 491,001

[22] Filed: May 3, 1983

[51] Int. Cl.$^4$ ............................................. H03K 3/02
[52] U.S. Cl. .................... 328/109; 307/518; 307/479; 307/265; 328/110; 328/134; 328/55
[58] Field of Search ............. 307/269, 510, 479, 511, 307/514, 440, 518, 265, 266, 267; 328/134, 109, 133, 55, 155, 63, 62, 110; 331/1 A, 25; 375/119–120

[56] References Cited

U.S. PATENT DOCUMENTS 3,986,125 10/1976 Eibner ................................. 328/62
4,122,404 10/1978 Fuhrman ........................... 331/1 A Primary Examiner—Stanley D. Miller
Assistant Examiner—R. R. Roseen
Attorney, Agent, or Firm—Robert M. Angus; Joseph A. Genovese

[57] ABSTRACT

A phase comparator and data separator is disclosed capable of establishing a detection window of the order of 100 percent of the clock cycle at a data recovery rate at least as great as 100 MHz. One of the preferred embodiments of the invention comprises three bistable flip-flops interconnected with OR gates to respond to a data input pulse stream and a clock pulse stream to provide, in response to each data pulse, a reference pulse having a width equal to the bit cell period and a variable pulse having a duration which is greater or less than the reference pulse duration in accordance with the direction and amount of time displacement of the input pulse from the center of the bit cell in which the input pulse occurs.

8 Claims, 5 Drawing Figures

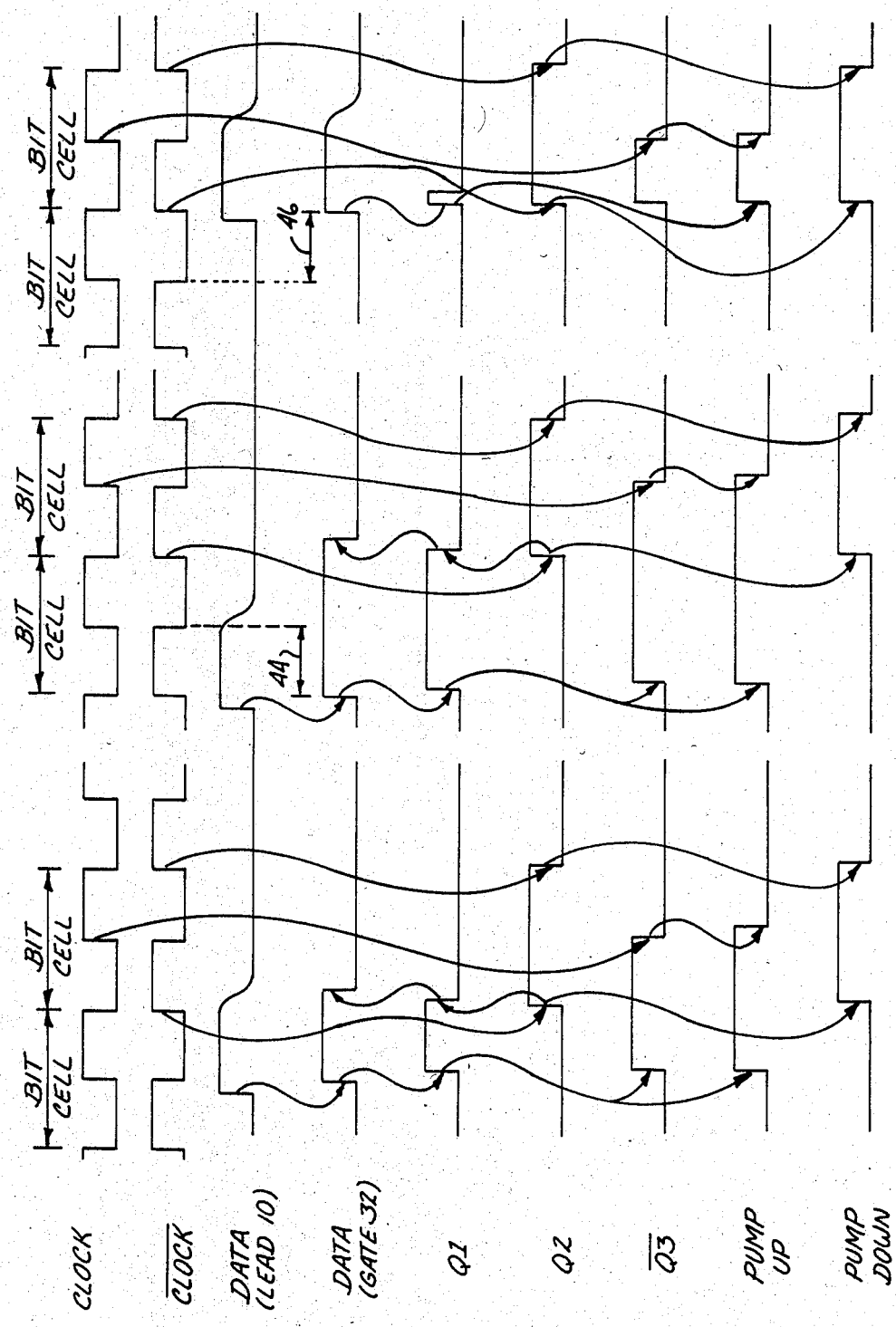

PHASE COMPARATOR AND DATA SEPARATOR

This invention relates to phase comparators and data separators, and particularly to phase comparators useful for data recovery at relatively high data rates.

Phase comparators are useful to detect the phase relationship between input data pulses and clock pulses to adjust the phase and frequency of the oscillator generating the clock pulse signal in response to detected phase shifts of the data pulses. Ideally, the leading edge of the data pulse will be at the center of the bit cell and coincident with the edge of a clock pulse appearing there. However, because the data pulse may actually lead or lag the clock pulse, it is necessary to establish a detection window during which the data pulse will be detected. The detection window should be as large as possible, occupying as much of the bit cell as possible. However, propagation delays and setup time required to operate the phase comparator may diminish the detection window. For example, at data rates of the order of 100 MHz, the clock cycle is 10 nanoseconds in duration and propagation delays and setup times should be taken into consideration.

Prior phase comparators have not been altogether satisfactory for detecting input data at relatively high data rates (i.e, of the order of 100 MHz). Principally, the problem with prior comparators are that they are designed so that the propagation delays and setup times through the gate circuits are cumulative, thereby detracting from the available detection window.

The present invention concerns a phase comparator which is satisfactory for high-speed (100 MHz) data rates and which maintains a detection window of the order of 100 percent of the bit cell. A bit cell is the space in which the leading edge of a data pulse may occur, and is usually defined between two like points of successive clock pulses, such as between the falling edges of two successive clock pulses. The duration of the bit cell typically equals the duration of the clock cycle.

One feature of the present invention resides in the provision that the logic design eliminates the effects of cumulative gate propagation and setup delays through the various components of the phase comparator, thereby maximizing the detection window.

A phase comparator in accordance with the present invention is responsive to an input pulse stream and the clock pulse signal to establish a detection window. The phase comparator is responsive to an input pulse stream and a clock pulse signal for producing in response to each input pulse a reference pulse having a duration substantially equal to the duration of the bit cell and a variable pulse having a duration which is greater or less than the reference pulse duration in accordance with the direction and amount of time displacement of the input pulse from the center of the bit cell in which the input pulse occurs. The phase detector includes means responsive to the input pulse occurring in one bit cell for initiating the variable pulse, means responsive to the edge of a clock pulse occurring at the end of the bit cell for initiating the reference pulse, means responsive to the edge of a clock pulse occurring at the center of the next bit cell for terminating the variable pulse, and means responsive to the edge of the clock pulse at the end of the next bit cell for terminating the reference pulse.

One feature of the present invention resides in the fact that the reference pulse is equal to one clock cycle in duration and is fixed in relationship to the clock signal, and therefore is useful as a source of separated data.

Another feature of the present invention resides in the fact that effects of the propagation delays and setup tim are minimized.

The above and other features of this invention will be more fully understood from the following detailed description and the accompanying drawings, in which:

FIGS. 3A through 3C are waveforms useful in explaining the operation of the phase comparator and data separator illustrated in FIG. 2.

Figure 1:
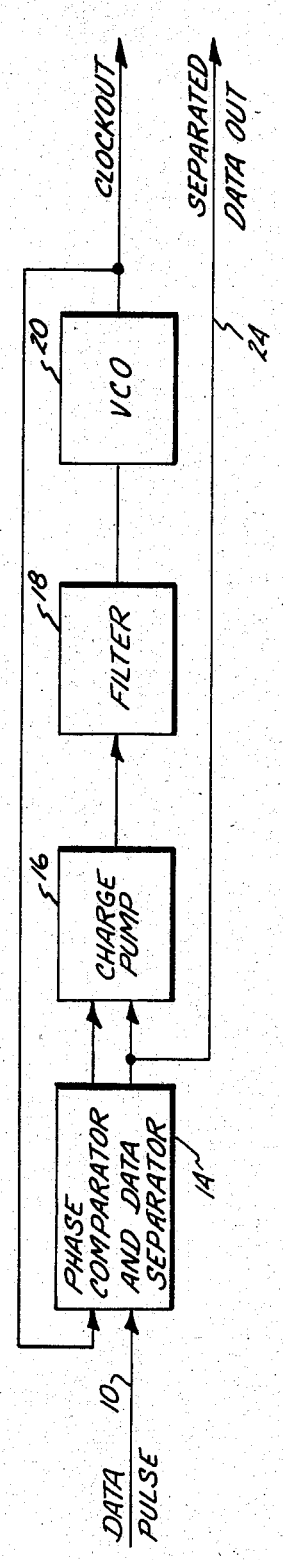
FIG. 1 is a block diagram of a phase locked loop circuit for data recovery incorporating a phase comparator and data separator in accordance with the present invention.

With reference to FIG. 1 there is illustrated a phase locked loop circuit incorporating a phase comparator and data separator in acocrdance with the present invention. The phase locked loop includes an input 10 for inputting data pulses from the read circuits of a disk drive or other similar data recovery or storage device. Input data pulses are inputted to phase comparator and data separator 14, which in turn provides pump-up and pump-down outputs to charge pump 16. Charge pump 16 provides signals through low-pass filter 18 to voltage controlled oscillator 20. Oscillator 20 provides a square-wave clock pulse signal output via lead 22 and provides input to phase comparator and data separator 14. Separated output data is read from lead 24 from phase comparator and data separator 14.

In operation of the apparatus shown in FIG. 1, phase comparator and data separator 14 provides pump-up and pump-down signals to charge pump 16. Charge pump 16 provides charging and discharging current signals to filter 18, which in turn provides a voltage signal to oscillator 20 to control the frequency of symmetrical oscillation of the oscillator.

Figure 2:
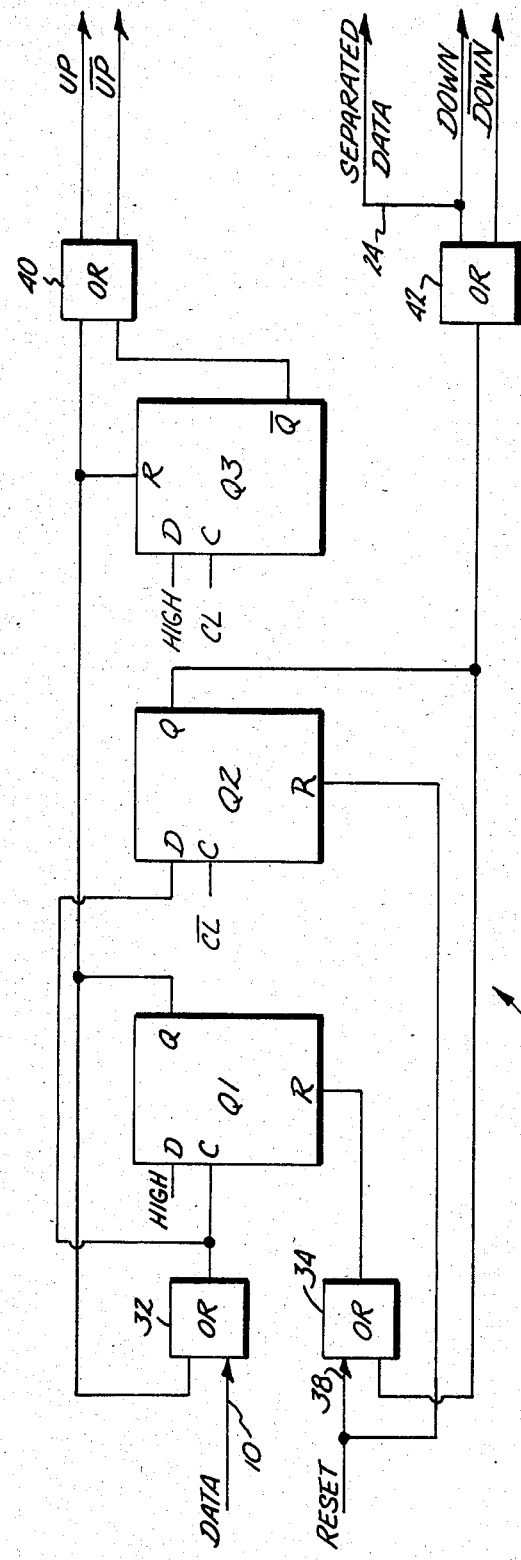
FIG. 2 is a block circuit diagram of a phase comparator and data separator in accordance with the presently preferred embodiment of the present invention.

FIG. 2 is a block circuit diagram of a phase comparator and data separator 14 in accordance with the presently preferred embodiment of the present invention for use in the circuit in FIG. 1. The phase comparator and data separator 14 illustrated in FIG. 2 includes a pair OR gates 32 and 34; one input of OR gate 32 being connected to receive data pulses via lead 10 and one input of OR gate 34 being adapted to receive a reset signal via lead 38. The output of OR gate 32 is connected to the clock input of D-type flip-flop Q1 and to the D input of D-type flip-flop Q2. The output of OR gate 34 is connected to the reset input of flip-flop Q1. The Q output of flip-flop Q1 is connected to a second input of OR gate 32 and to the reset input of D-type flip-flop Q3. The Q output of flip-flop Q1 is also connected to the input of single input OR gate 40. The reset input of flip-flop Q2 is connected to lead 38 to receive reset signals. The Q output of flip-flop Q2 is connected to a second input of OR gate 34 and to the input of OR gate 42. The inverted (Q-not) output of flip-flop Q3 is connected to a second input of OR gate 40. Clock signals from oscillator 20 are provided to the clock input of flip-flop Q3 and not-clock (or inverted clock) signals from oscillator 20 are provided to the clock input of flip-flop Q2. Gates 40 and 42 provide pump up, not-pump up, pump down and not-pump down signals to charge pump 16 in FIG. 1. High logic level signals are provided to the D inputs of flip-flops Q1 and Q3.

A D-type flip-flop (such as flip-flops Q1, Q2 and Q3) is one which transfers the logic level appearing at the D input to the Q output whenever the edge of a signal (usualy positive) is applied to the clock input in absence of a high level signal at the reset input. A high level signal at the reset input will asynchronously set the Q output low and the Q-not output high. The signal at the D input of the flip-flop must appear before the leading edge of the signal at the clock input by a duration at least equal to the setup time of the flip-flop.

In operation of the circuit illustrated in FIG. 2, flip-flop Q1 is responsive to the edge of an input data pulse from OR gate 32 to initiate a variable-duration pump-up pulse. The duration of the data pulse should be less than one clock cycle. When an input data pulse appears on lead 10, OR gate 32 is operated to provide a leading edge of a signal to the clock input of flip-flop Q1, thereby setting the Q output of flip-flop Q1 to a high condition. Flip-flop Q3 is responsive to the high Q output from flip-flop Q1 to be reset to provide a high Q-not output, thereby maintaining the variable-duration pump-up pulse. Thus, the high Q output from flip-flop Q1 operates on the reset input of flip-flop Q3 to provide a high Q-not output. OR gate 40 receives inputs from the Q output of flip-flop Q1 and the Q-not output of flip-flop Q3 to provide the pump-up pulse signal. Also, the output from flip-flop Q1 operates OR gate 32 to maintain a high level signal at the C input of flip-flop Q1. Flip-flop Q2 is responsive to the leading edge of a not-clock pulse occurring at the end of the bit cell to initiate the reference pump-down pulse signal. With gate 32 producing a high output for the D input of flip-flop Q2, upon the presence of the not-clock pulse at the end of the bit cell, the Q output of flip-flop Q2 is set to a high condition to provide a signal to OR gates 34 and 42. The signal at OR gate 34 serves to reset flip-flop Q1 to terminate the high Q output signal to the reset input of flip-flop Q3, OR gate 32 and OR gate 40. The pump-up signal from gate 40 remains high due to the high Q-not output from flip-flop Q3. The signal to gate 42 serves to set the pump-down signal high. Flip-flop Q3 is responsive to the edge of a clock pulse occurring at the center of the bit cell following that in which the data pulse occurred to terminate the variable pump-up pulse signal. Thus, with the Q output from flip-flop Q1 low, upon the next clock pulse to the clock input of flip-flop Q3, flip-flop Q3 becomes set, thereby setting its Q-not output low. With both the Q output from flip-flop Q1 and the Q-not output from flip-flop Q3 low, OR gate 40 is operated to terminate the pump-up signal. With the data pulse terminated on lead 10 and the Q output from flip-flop Q1 low, the D input to flip-flop Q2 is low, but flip-flop Q2 will continue to provide a high Q output until the next not-clock signal occurs whereupon it will be reset (Q output low) to terminate the pump-down signal. Thus, flip-flop Q2 is responsive to the edge of a not-clock pulse occurring at the end of the bit cell following that in which the data pulse occurred to terminate the reference pump-down pulse signal.

It will be appreciated that the duration of pump-down signals passed by gate 42 will be exactly one clock cycle long. The pump-up signal is set high when OR gate 40 is operated by the setting of flip-flop Q1. The setting of flip-flop Q1 also resets flip-flop Q3 to provide a high Q-not output to gate 40 to maintain the presence of the pump-up signal after resetting flip-flop Q1. The pump-up signal will be terminated in response to setting of flip-flop Q3 at the center of the bit cell following that in which the data pulse occurred.

With reference to FIg. 3, the operation of the circuit illustrated in FIG. 2 may be readily explained. In FIG. 3A, the leading edge of the data pulse from gate 32 to the clock input of flip-flop Q1 is coincident with the leading edge of the clock pulse at the clock input of flip-flop Q3. Under these conditions, the data pulse is at its nominal position, in the center of the bit cell, and the positive edge of the pump-up signal will precede the positive edge of the pump-down signal by one-half of the clock period. Further, as heretofore explained, the pump-down signal is always equal to the duration of the clock period. When the data pulse is in its nominal position as illustrated in FIG. 3A, the pump-on signal will be equal in duration to the pump-down signal. If the three flip-flops are constructed on the same semiconductor chip so that the propagation delays between the D and Q terminals is the same for each flip-flop, it can be shown that the duration of the pump-down signal will be exactly equal in duration to the clock period and (when the data pulse is in its nominal position) the pump-up signal is also equal in duration to the clock period. Hence, with the data pulses in their nominal position shown in FIG. 3A, the pump-up and pump-down signals are exactly equal in duration, and the resultant current supplied to filter 18 is zero so no change will occur in the filter output voltage. Consequently, oscillator 22 will not be altered in phase or frequency.

The propagation delay in setting the reference pump-down signal is equal to the propagation delay from the D input to the Q output of flip-flop Q2, plus the propagation delay through OR gate 42. The propagation delay to terminate the reference pump-down signal is equal to the propagation delay from the D input to the Q output of flip-flop Q2, plus the propagation delay through OR gate 42. The reference pump-down signal will be equal in duration to the clock cycle, minus the propagation delay to set the pump-down signal, plus the propagation delay to terminate the pump-down signal. Since the two propagation delays are equal, their effects are cancelled and the pump-down signal will always equal the clock cycle.

The propagation delay in setting the variable pump-up signal is equal to the propagation delay from the clock input to the Q output of flip-flop Q1, plus the propagation delay through OR gate 40; whereas the propagation delay in terminating the pump-up signal equals the propagation delay from the clock input to the Q output of flip-flop Q3, plus the propagation delay through OR gate 40. Since the flip-flops are configured on a single chip, the propagation delays for each flip-flop are equal. Hence, the variable pump-up signal will be equal in duration to the duration between the input pulse and the center of the bit cell following that in which the input pulse occurred, minus the propagation delay to set the pump-up signal, plus the propagation delay to terminate the pump-up signal. Since the two propagation delays are equal, their effects are cancelled and the duration of the pump-up signal will always equal the duration between the input pulse and the center of the bit cell following that in which the input pulse occurred.

FIG. 3B illustrates the condition where the data pulse arrives early, the relationship of the data pulse to its correct position being illustrated by arrow 44 in FIG. 3B. In one embodiment of the invention, the set-up time for a flip-flop is measured at 0.5 nanoseconds. In the maximum early case, the data pulse may arrive as early as one-half of a bit cell plus the set-up time of flip-flop Q2 before the center of the bit cell in which the data pulse appears. Therefore, at 100 MHz (where the bit cell is 10 nanoseconds in duration), the data pulse may arrive as early as 5.5 nanoseconds before the center of the bit cell. Hence, the leading edge of the data pulse will cause the leading edge of the pump-up signal to proceed the leading edge of the pump-down signal by as much as a full clock cycle plus the set-up time of flip-flop Q2. A comparison of the pump-up and pump-down signals in FIG. 3B will illustrate that the pump-up signal may be slightly more than 50 percent greater than the pump-down signal, thereby serving to adjust the voltage controlled oscillator to speed up the oscillator to more nearly approach the condition illustrated in FIG. 3A. Note, too, that the pump-down signal is a full clock cycle in duration. The pump-up signal will, in a maximum early condition, be as much as 1.5 clock cycles plus the set-up time of flip-flop Q2.

FIG. 3C illustrates the condition where the data arrives late, the relationship of the data pulse to the nominal position being illustrated by arrow 46. The maximum late case illustrated in FIG. 3C is limited only by the set-up time of flip-flop Q2. The signal at the D input of flip-flop Q2 must appear before the not-clock signal at the clock input by a duration at least equal to the set-up time of the flip-flop. Hence, at 100 MHz and a set-up time for flip-flop Q2 of 0.5 nanoseconds, the data pulse may arrive as late as 4.5 nanoseconds after the center of the bit cell. Thus, as can be seen in FIG. 3, the pump-down signal is one clock cycle in duration, but the pump-up signal may be as short as 0.5 clock cycle, plus set-up time for flip-flop Q2, in duration. Because the pump-down signal is longer than the pump-up signal, the voltage controlled oscillator 20 will be caused to slow down.

The size of the detection window is defined as the sum of the displacement of the leading edge of the data pulse from the center of the bit cell for the maximum early case, plus the displacement of the leading edge of the data pulse from the center of the bit cell for a maximum late case. The displacement for the maximum early case is one-half the bit cell plus the set-up time for flip-flop Q2, whereas the displacement for the maximum late case is one-half the bit cell less the set-up time for flip-flop Q2. Hence, for any given frequency of the clock signal, the detection window equals the duration of the bit cell, which is 100 percent of the clock cycle.

One feature of the present invention may be gleaned from an inspection of the pump-down signals and their relationship to nominal position of the data pulses. The duration of the pump-down pulse is fixed at exactly one clock cycle, and appears only upon the arrival of a data pulse. Also, the pump-down signal is fixed in positional relationship to the clock pulses. Consequently, the pump-down signal may serve as a source of separated data for output via lead 24. The separated data pulse or pump-down signal will be relatively free from problems associated with phase shift, peak shift, data pulse duration and high frequency noise.

To switch the phase comparator and data separator off a reset signal on lead 38 will reset both flip-flops Q1 and Q2. Upon the next clock pulse, flip-flop Q3 will be set to remove the Q-not signal. Consequently OR gates 40 and 42 will provide low level signals for the pump-up and pump-down outputs.

It will be appreciated that the leading edge of the not-clock pulse appearing at the clock input of flip-flop Q2 (occurring at the end of the bit cell) will cause the high level signal at the reset input of flip-flop Q3 to be removed. It will also be appreciated that the high level signal at the reset input of flip-flop Q3 should be removed before the leading edge of the clock pulse appears at the clock input of flip-flop Q3 (occurring at the center of the next bit cell). Consequently, the sum of the propagation delays through flip-flop Q2, OR gate 34 and flip-flop Q1 should be no greater than about one-half of duration of the bit cell (no greater than 5 nanoseconds for a clock frequency of 100 MHz).

The present invention thus provides an effective phase comparator for controlling a voltage controlled oscillator in a data recovery circuit. Also, the phase comparator provides signals for controlling the oscillator, one of which can be used as a separated data output for further processing. The phase comparator provides an excellent detection window which is a full clock cycle long. As a result, higher frequency of the read data may be achieved than could be achieved in prior systems. Further, the comparator does not require any delay lines as required in previous comparator systems. Also, as can be seen from FIG. 3, the pump-up and pump-down signals will overlap each other by one-half clock cycle.

This invention is not to be limited by the embodiment shown in the drawings and described in the description, which is given by way of example and not of limitation, but only in accordance with the scope of the appended claims.

What is claimed is:

1. A phase comparator responsive to an input pulse stream and a clock pulse signal, said clock pulse signal having a succession of clock pulse edges defining the center and end of successive bit cells, said phase comparator producing in response to the edge of each input pulse a reference pulse having a duration equal to one bit cell and a variable pulse having a duration which is greater or less than the reference pulse duration in accordance with the dirction and amount of time displacement of the input pulse from the center of the bit cell in which the input pulse occurs, said phase comparator comprising:
   means responsive to the edge of an input pulse occurring in one bit cell for initiating a variable pulse,
   means responsive to the edge of a clock pulse occurring at the end of said one bit cell for initiating a reference pulse,
   means responsive to the edge of a clock pulse occurring at the center of the next bit cell following said one bit cell for terminating said variable pulse, and
   means responsive to the edge of a clock pulse occurring at the end of said next bit cell for terminating said reference pulse.

2. Apparatus according to claim 1 wherein said means responsive to the edge of said input pulse comprises a first bistable means which switches from a first state to a second state in response to the edge of said input pulse to initiate said variable pulse, and third bistable means responsive to the second state of said first bistable means to switch from a first state to a second state of said third bistable means to maintain said variable pulse.

3. Apparatus according to claim 2 wherein said means responsive to the edge of a clock pulse occurring at the end of said one bit cell comprises a second bistable means responsive to the edge of a clock pulse occurring at the end of said one bit cell to initiate said reference pulse.

4. Apparatus according to claim 3 wherein said means responsive to the edge of a clock pulse occurring at the center of said next bit cell comprises said third bistable means responsive to the edge of a clock pulse occurring at the center of said next bit cell to switch said third bistable means from its second state to its first state to terminate maintenance of said variable pulse by said third bistable means.

5. Apparatus according to claim 4 wherein said means responsive to the edge of a clock pulse occurring at the end of said next bit cell comprises said second bistable means responsive to the edge of a clock pulse occurring at the end of said next bit cell to switch said second bistable means from its second state to its first state to terminate said reference pulse.

6. A phase comparator responsive to an input pulse stream and a clock pulse signal, said clock pulse signal having a succession of clock pulse edges defining the center and end of successive bit cells, said phase comparator producing in response to the edge of each input pulse a reference pulse having a duration equal to one bit cell and a variable pulse having a duration which is greater or less than the reference pulse duration in accordance with the direction and amount of time displacement of the input pulse from the center of the bit cell in which the input pulse occurs, said phase comparator comprising first OR gate means having a first input connected to receive said first input pulse stream, having a second input and having an output;

first D-type flip-flop means having a clock input connected to the output of said first OR gate means, having a D input connected to a source, having a reset input, and having a Q output connected to said second input of said first OR gate means;

second D-type flip-flop means having a clock input connected to receive clock pulse signals of a first type, having a D input connected to the output of said first OR gate means, and having a Q output connected to operate the reset input of said first flip-flop means, said Q output of said second flip-flop means providing said reference pulse;

third D-type flip-flop means having a clock input connected to receive clock pulse signals of a second type, having a D input connected to a source, having a reset input connected to said Q output of said first flip-flop means, and having a Q-not output, said clock pulse signals of said second type being opposite in polarity to said clock pulse signals of said first type; and second OR gate means having a first input connected to said Q output of said first flip-flop means and a second input connected to said Q-not output of said third flip-flop means and having a output providing said variable pulse.

7. Apparatus according to claim 3 wherein said first bistable means is responsive to said second bistable means initiating said reference pulse to switch said first bistable means from its second to its first state.

8. Apparatus according to claim 6 further including third OR gate means having a first input connected to the Q output of said second flip-flop means, having a second input connected to receive a reset signal, and having an output connected to said reset input of said first flip-flop means; said second flip-flop means having a reset input connected to receive said reset signal.

* * * * *